United States Patent
Ochi et al.

(10) Patent No.: US 10,991,910 B2
(45) Date of Patent: Apr. 27, 2021

(54) DISPLAY DEVICE AND PRODUCTION METHOD THEREFOR

(71) Applicants: Sharp Kabushiki Kaisha, Sakai (JP); SAKAI DISPLAY PRODUCTS CORPORATION, Sakai (JP)

(72) Inventors: Takashi Ochi, Sakai (JP); Tohru Sonoda, Sakai (JP); Takeshi Hirase, Sakai (JP); Katsuhiko Kishimoto, Sakai (JP)

(73) Assignees: SHARP KABUSHIKI KAISHA, Sakai (JP); SAKAI DISPLAY PRODUCTS CORPORATION, Osaka (JP)

( * ) Notice: Subject to any disclaimer, the term of this patent is extended or adjusted under 35 U.S.C. 154(b) by 0 days.

(21) Appl. No.: 16/494,816

(22) PCT Filed: Mar. 30, 2017

(86) PCT No.: PCT/JP2017/013436
§ 371 (c)(1),
(2) Date: Sep. 17, 2019

(87) PCT Pub. No.: WO2018/179288
PCT Pub. Date: Oct. 4, 2018

(65) Prior Publication Data
US 2020/0083478 A1    Mar. 12, 2020

(51) Int. Cl.
*H01L 51/52*    (2006.01)
*H01L 27/32*    (2006.01)
(Continued)

(52) U.S. Cl.
CPC ...... *H01L 51/5253* (2013.01); *H01L 27/3244* (2013.01); *H01L 51/0097* (2013.01);
(Continued)

(58) Field of Classification Search
CPC ............ H01L 51/5253; H01L 27/3244; H01L 51/0097; H01L 51/5246; H01L 51/56;
(Continued)

(56) References Cited

U.S. PATENT DOCUMENTS 10,497,907 B1 * 12/2019 Matsui ............... H01L 51/5256
2005/0212419 A1   9/2005 Vazan et al.
(Continued)

FOREIGN PATENT DOCUMENTS

JP    2005-335067 A    12/2005
JP    2007-220593 A     8/2007
(Continued)

OTHER PUBLICATIONS

Official Communication issued in International Patent Application No. PCT/JP2017/013436, dated Jun. 20, 2017.

*Primary Examiner* — Ahmed N Sefer
(74) *Attorney, Agent, or Firm* — Keating & Bennett, LLP

(57) ABSTRACT

An encapsulation film covering a light emitting element includes: a first inorganic layer covering the light emitting element; an organic layer formed on the first inorganic layer; a second inorganic layer formed on the organic layer; and a third inorganic layer formed on the second inorganic layer. The peripheral end face of the second inorganic layer is aligned with the peripheral end face of the organic layer. The third inorganic layer covers the peripheral end face of the first inorganic layer or the peripheral end face of the second inorganic layer.

5 Claims, 7 Drawing Sheets

(51) Int. Cl.
*H01L 51/00* (2006.01)
*H01L 51/56* (2006.01)

(52) U.S. Cl.
CPC .......... *H01L 51/5246* (2013.01); *H01L 51/56* (2013.01); *H01L 2227/323* (2013.01); *H01L 2251/5338* (2013.01)

(58) Field of Classification Search
CPC ....... H01L 2227/323; H01L 2251/5338; Y02E 10/549; H05B 33/04; H05B 33/10; G09F 9/30
See application file for complete search history.

(56) References Cited

U.S. PATENT DOCUMENTS

| | | |
|---|---|---|
| 2007/0194711 A1 | 8/2007 | Matsuura et al. |
| 2010/0213833 A1* | 8/2010 | Kawachi ............. H01L 51/5203 313/504 |
| 2013/0092972 A1* | 4/2013 | Kim ................... H01L 51/5256 257/100 |
| 2015/0034920 A1 | 2/2015 | Jang et al. |
| 2016/0072099 A1* | 3/2016 | Okamoto ................ C23C 16/50 257/40 |
| 2016/0204374 A1 | 7/2016 | Sonoda et al. |
| 2017/0133630 A1* | 5/2017 | Kim ................... H01L 51/5246 |
| 2017/0324061 A1* | 11/2017 | Sonoda ............... H01L 51/0097 |
| 2018/0083225 A1* | 3/2018 | Nishikawa .......... H01L 51/5256 |

FOREIGN PATENT DOCUMENTS

| | | | |
|---|---|---|---|
| JP | 2011-146323 A | 7/2011 | |
| JP | 2012-119338 A | 6/2012 | |
| JP | 2015-176717 A | 10/2015 | |
| WO | 2014/174892 A1 | 10/2014 | |
| WO | WO-2014174892 A1 * | 10/2014 | ........... C23C 16/345 |
| WO | 2015/029608 A1 | 3/2015 | |

* cited by examiner

DISPLAY DEVICE AND PRODUCTION METHOD THEREFOR

TECHNICAL FIELD

The present invention relates to a display device and a production method therefor.

BACKGROUND ART

In recent years, self-luminous organic electroluminescence (EL) display devices using an organic EL element have attracted attention as an alternative display device to liquid crystal display devices. In an encapsulation structure proposed for the organic EL display devices in order to restrain degradation of the organic EL element due to contamination with moisture, oxygen, etc., an encapsulation film covering the organic EL element is a multilayered film of inorganic and organic films.

For example, Patent Document 1 discloses an organic EL light emitting device in which an uneven structure that restricts resin, which will become a buffer layer covering an organic EL layer, from spreading after being applied is formed in a region surrounding a light emitting region.

Patent Document 2 discloses a method for producing an organic EL element structure in which an multilayered element portion is covered with a first barrier film formed by an atomic layer deposition (ALD) method, the first barrier film is covered with an organic film formed by an isotropic film deposition method, the organic film is anisotropically etched, and the first barrier film is covered with a second barrier film.

CITATION LIST

Patent Documents

PATENT DOCUMENT 1: Japanese Unexamined Patent Publication No. 2011-146323
PATENT DOCUMENT 2: Japanese Unexamined Patent Publication No. 2015-176717

SUMMARY OF THE INVENTION

Technical Problem

In the organic EL light emitting device disclosed in Patent Document 1, the uneven structure that restricts resin from spreading needs to be formed in the region surrounding the light emitting region. It is therefore difficult to implement an organic EL display device with a narrower frame.

In the method for producing an organic EL element structure disclosed in Patent Document 2, when there is foreign matter on the first barrier film, the organic film on the foreign matter may also be removed by the anisotropic etching. This results in reduction in encapsulation capability.

The present invention was developed in view of the above circumstances and it is an object of the present invention to implement a display device having an encapsulation film with sufficient encapsulation capability and to accurately form the peripheral end of an organic layer and thus implement a display device with a narrower frame.

Solution to the Problem

In order to achieve the above object, a display device according to the present invention is a display device which includes a base substrate, a light emitting element provided on the base substrate, and an encapsulation film covering the light-emitting element, and in which a display region is defined by the light emitting element. The display device is characterized in that the encapsulation film includes a first inorganic layer covering the light emitting element, an organic layer formed on the first inorganic layer, a second inorganic layer formed on the organic layer, and a third inorganic layer formed on the second inorganic layer, a peripheral end face of the second inorganic layer is aligned with a peripheral end face of the organic layer, and the third inorganic layer covers a peripheral end face of the first inorganic layer or the peripheral end face of the second inorganic layer.

Advantages of the Invention

The peripheral end face of the second inorganic layer is aligned with the peripheral end face of the organic layer, and the third inorganic layer covers the peripheral end face of the first inorganic layer or the peripheral end face of the second inorganic layer. Accordingly, a display device having an encapsulation film with sufficient encapsulation capability is implemented. Moreover, the peripheral end of the organic layer is accurately formed, and a display device with a narrower frame is thus implemented.

DESCRIPTION OF EMBODIMENTS

Embodiments of the present invention will be described in detail with reference to the accompanying drawings. The present invention is not limited to the following embodiments.

First Embodiment

Figure 1:
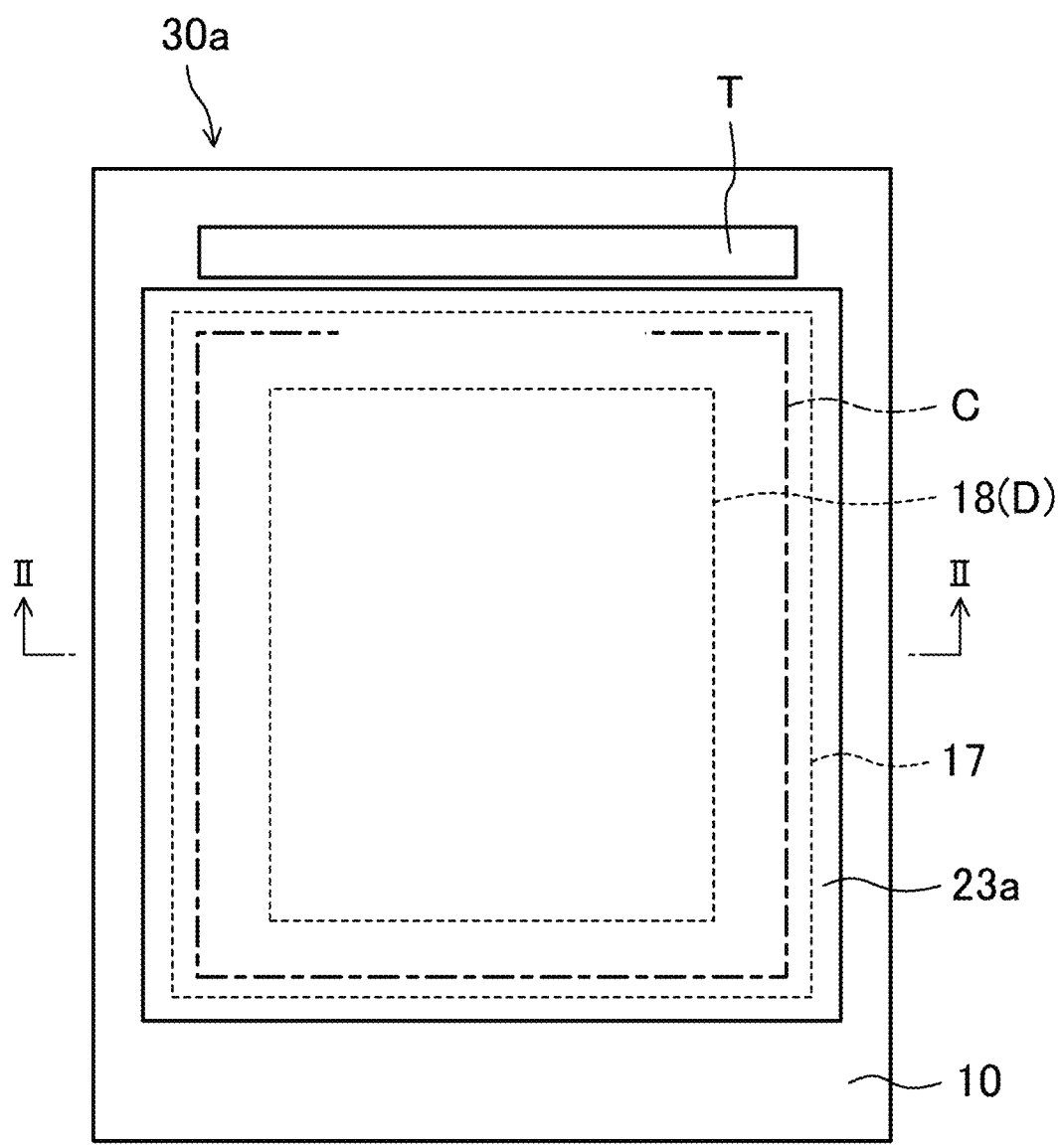
FIG. 1 is a plan view showing a schematic configuration of an organic EL display device according to a first embodiment of the present invention.
Figure 2:
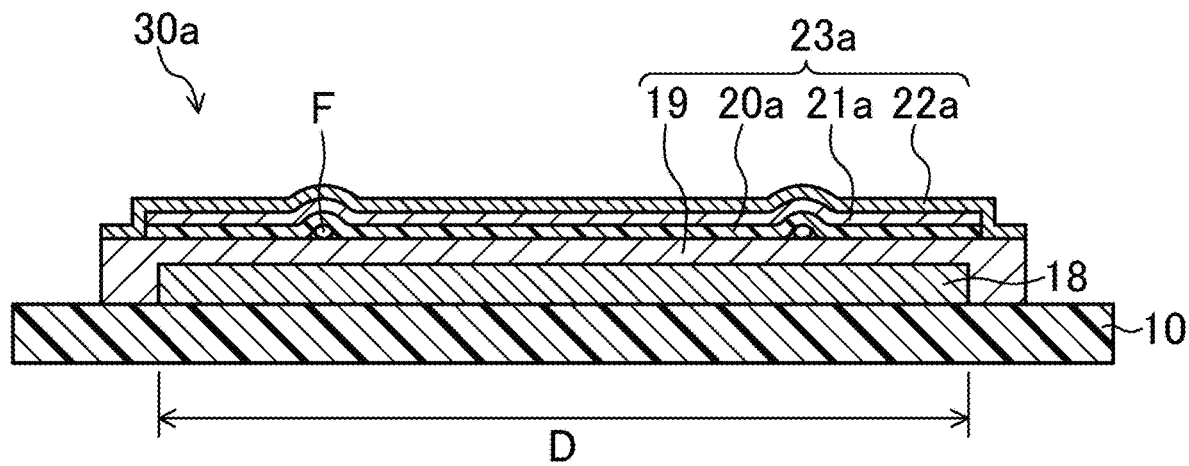
FIG. 2 is a sectional view showing a schematic configuration of the organic EL display device taken along line II-II in FIG. 1.
Figure 3:
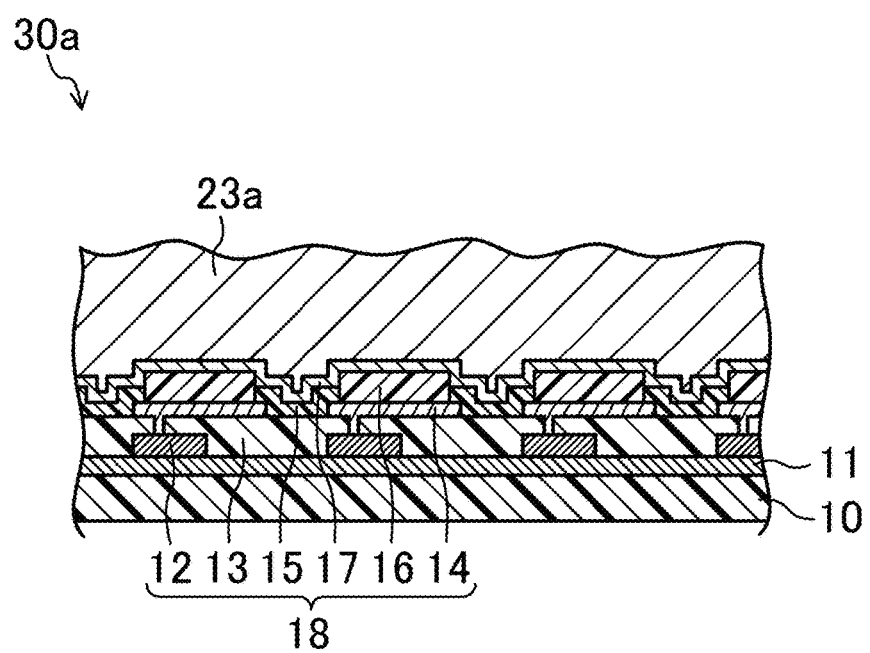
FIG. 3 is a sectional view showing an internal configuration of the organic EL display device according to the first embodiment of the present invention.
Figure 4:
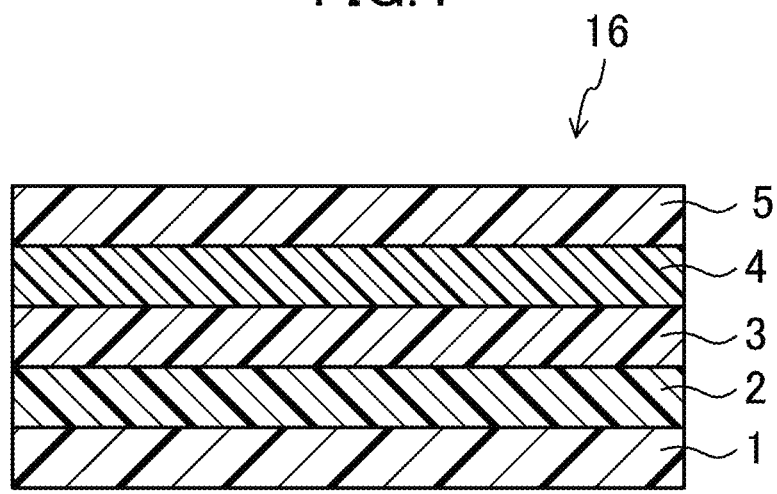
FIG. 4 is a sectional view of an organic EL layer forming the organic EL display device according to the first embodiment of the present invention.

FIGS. 1 to 9 illustrate a first embodiment of a display device according to the present invention. FIG. 1 is a plan view showing a schematic configuration of an organic EL display device 30a of the present embodiment. FIG. 2 is a sectional view showing a schematic configuration of the organic EL display device 30a taken along line II-II in FIG. 1. FIG. 3 is a sectional view showing an internal configuration of the organic EL display device 30a. FIG. 4 is a sectional view of an organic EL layer 16 forming the organic EL display device 30a.

As shown in FIGS. 1 to 3, the organic EL display device 30a includes: a base substrate 10; an organic EL element 18 serving as a light emitting element and formed on the base substrate 10 with a basecoat film 11 interposed therebetween; and an encapsulation film 23a covering the organic EL element 18. As shown in FIG. 1, the encapsulation film 23a extends to a position outside a connection portion C between a second electrode 17 described below and a wiring in an underlying layer which is connected to the second electrode 17, but the encapsulation film 23a does not reach a terminal region T for electrical connection to external circuits. The encapsulation film 23a also extends to a position outside the second electrode 17 covering an entire display region D. In FIG. 1, the connection portion C is a continuous portion surrounding the display region D. However, the connection portion C may be comprised of a plurality of separate portions or may be formed along one side of the display region D or a part of one side of the display region D. As shown in FIGS. 1 and 2, in the organic EL display device 30a, the rectangular display region D where an image is displayed is defined by the organic EL element 18, and a plurality of pixels are arranged in a matrix in the display region D. For example, a sub-pixel for red gradation display, a sub-pixel for green gradation display, and a sub-pixel for blue gradation display are arranged next to each other in each pixel. In the organic EL display device 30a, a frame-shaped frame region is defined around the rectangular display region D, and the terminal region T is located in the frame region.

The base substrate 10 is, e.g., a flexible plastic substrate made of a polyimide resin etc.

The basecoat film 11 is, e.g., an inorganic insulating film such as a silicon oxide film or a silicon nitride film.

As shown in FIG. 3, the organic EL element 18 includes a plurality of TFTs 12, a planarizing film 13, a plurality of first electrodes 14, an edge cover 15, a plurality of organic EL layers 16, and the second electrode 17 which are sequentially formed on the basecoat film 11.

As shown in FIG. 3, the TFTs 12 are switching elements provided for each sub-pixel. For example, the TFT 12 includes: an island-shaped semiconductor layer formed on the basecoat film 11; a gate insulating film covering the semiconductor layer; a gate electrode formed on the gate insulating film and overlapping a part of the semiconductor layer; an interlayer insulating film covering the gate electrode; and a source electrode and a drain electrode which are formed on the interlayer insulating film and are separated from each other. Although the top-gate TFTs 12 are shown in the present embodiment, the TFTs 12 may be bottom-gate TFTs.

As shown in FIG. 3, the planarizing film 13 covers each TFT 12 except for a part of its drain electrode. The planarizing film 13 is made of, e.g., a colorless transparent organic resin material such as an acrylic resin.

As shown in FIG. 3, the plurality of first electrodes 14 are arranged in a matrix on the planarizing film 13 such that the plurality of first electrodes 14 correspond to the plurality of sub-pixels. As shown in FIG. 3, the first electrodes 14 are connected to the drain electrodes of the TFTs 12 through contact holes formed in the planarizing film 13. The first electrodes 14 have a function to inject holes (positive holes) into the organic EL layers 16. In order to improve efficiency of hole injection into the organic EL layers 16, it is more preferable that the first electrodes 14 be made of a material with a high work function. Examples of the material of the first electrodes 14 include metal materials such as silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). Other examples of the material of the first electrodes 14 include alloys such as magnesium (Mg)/copper (Cu), magnesium (Mg)/silver (Ag), sodium (Na)/potassium (K), astatine (At)/astatine oxide ($AtO_2$), lithium (Li)/aluminum (Al), lithium (Li)/calcium (Ca)/aluminum (Al), and lithium fluoride (LiF)/calcium (Ca)/aluminum (Al). Still other examples of the material of the first electrodes 14 include conductive oxides such as tin oxide (SnO), zinc oxide (ZnO), indium tin oxide (ITO), and indium zinc oxide (IZO), etc. The first electrodes 14 may have a multilayered structure comprised of layers of the above materials. Examples of the material with a high work function include indium tin oxide (ITO) and indium zinc oxide (IZO).

As shown in FIG. 3, the edge cover 15 is formed in a grid pattern such that the edge cover 15 covers a periphery of each of the first electrodes 14. Examples of the material of the edge cover 15 include inorganic films such as silicon oxide ($SiO_2$), silicon nitride ($SiN_x$ (x is a positive number)) like trisilicon tetranitride ($Si_3N_4$), and silicon oxynitride (SiNO), and organic films such as polyimide resin, acrylic resin, polysiloxane resin, and novolac resin.

As shown in FIG. 3, the plurality of organic EL layers 16 are arranged in a matrix on the first electrodes 14 such that the plurality of organic EL layers 16 correspond to the plurality of sub-pixels. As shown in FIG. 4, the organic EL layer 16 includes a hole injection layer 1, a hole transport layer 2, a light emitting layer 3, an electron transport layer 4, and an electron injection layer 5 which are sequentially formed on the first electrode 14.

The hole injection layer 1 is also called an anode buffer layer and functions to make the energy levels of the first electrode 14 and the organic EL layer 16 close to each other to improve efficiency of hole injection from the first electrode 14 into the organic EL layer 16. Examples of the material of the hole injection layer 1 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, and stilbene derivatives.

The hole transport layer 2 functions to improve efficiency of hole transport from the first electrode 14 to the organic EL layer 16. Examples of the material of the hole transport layer 2 include porphyrin derivatives, aromatic tertiary amine compounds, styrylamine derivatives, polyvinylcarbazole, poly-p-phenylene vinylene, polysilanes, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, and zinc selenide.

The light emitting layer 3 is a region where holes and electrons are injected from the first electrode 14 and the second electrode 17, respectively, and recombine when a voltage is applied by the first electrode 14 and the second electrode 17. The light emitting layer 3 is made of a material with high emission efficiency. Examples of the material of the light emitting layer 3 include metal oxinoid compounds (8-hydroxyquinoline metal complexes), naphthalene derivatives, anthracene derivatives, diphenylethylene derivatives, vinylacetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, trisstyrylbenzene derivatives, perylene derivatives, perinone derivatives, aminopyrene derivatives, pyridine derivatives, rhodamine derivatives, aquidine derivatives, phenoxazone, quinacridone derivatives, rubrene, poly-p-phenylene vinylene, and polysilanes.

The electron transport layer 4 functions to efficiently move electrons to the light emitting layer 3. Examples of the material of the electron transport layer 4 include organic compounds such as oxadiazole derivatives, triazole derivatives, benzoquinone derivatives, naphthoquinone derivatives, anthraquinone derivatives, tetracyanoanthraquinodimethane derivatives, diphenoquinone derivatives, fluorenone derivatives, silole derivatives, and metal oxinoid compounds.

The electron injection layer 5 functions to make the energy levels of the second electrode 17 and the organic EL layer 16 close to each other to improve efficiency of electron injection from the second electrode 17 into the organic EL layer 16. With this function, the drive voltage for the organic EL element 18 can be reduced. The electron injection layer 5 is also called a cathode buffer layer. Examples of the material of the electron injection layer 5 include inorganic alkaline compounds such as lithium fluoride (LiF), magnesium fluoride ($MgF_2$), calcium fluoride ($CaF_2$), strontium fluoride ($SrF_2$), and barium fluoride ($BaF_2$), aluminum oxide ($Al_2O_3$), and strontium oxide (SrO).

As shown in FIG. 3, the second electrode 17 covers the organic EL layers 16 and the edge cover 15 and serves as a common electrode for the plurality of sub-pixels. The second electrode 17 functions to inject electrons into the organic EL layers 16. In order to improve efficiency of electron injection into the organic EL layers 16, it is more preferable that the second electrode 17 be made of a material with a low work function. Examples of the material of the second electrode 17 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). Other examples of the material of the second electrode 17 include alloys such as magnesium (Mg)/copper (Cu), magnesium (Mg)/silver (Ag), sodium (Na)/potassium (K), astatine (At)/astatine oxide ($AtO_2$), lithium (Li)/aluminum (Al), lithium (Li)/calcium (Ca)/aluminum (Al), and lithium fluoride (LiF)/calcium (Ca)/aluminum (Al). Still other examples of the material of the second electrode 17 include conductive oxides such as tin oxide (SnO), zinc oxide (ZnO), indium tin oxide (ITO), and indium zinc oxide (IZO). The second electrode 17 may have a multilayered structure comprised of layers of the above materials. Examples of the material with a low work function include magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), and lithium fluoride (LiF)/calcium (Ca)/aluminum (Al).

As shown in FIG. 2, the encapsulation film 23a includes a first inorganic layer 19 covering the organic EL element 18, an organic layer 20a and a second inorganic layer 21a which are sequentially formed on the first inorganic layer 19, and a third inorganic layer 22a covering the peripheral end face of the organic layer 20a and the second inorganic layer 21a.

The first inorganic layer 19, the second inorganic layer 21a, and the third inorganic layer 22a are made of, e.g., an inorganic insulating film such as a silicon nitride film, a silicon oxide film, or a silicon oxynitride film. The second inorganic layer 21a is preferably made of, e.g., a silicon nitride film having high barrier properties. As shown in FIG. 2, foreign matter F called a particle is present on the surface of the first inorganic layer 19 which faces the organic layer 20a. It goes without saying that it is preferable that no foreign matter F be present on the surface of the first inorganic layer 19. The present embodiment illustrates a configuration in which foreign matter F is present on the interface between the first inorganic layer 19 and the organic layer 20a. However, foreign matter F may be present on, e.g., the interface between the organic EL element 18 and the first inorganic layer 19, and the organic layer 20a effectively encapsulates various kinds of foreign matter F present on the base substrate 10a side of the organic layer 20a.

As shown in FIG. 2, the peripheral end face of the first inorganic layer 19 is located outside the peripheral end faces of the organic layer 20a and the second inorganic layer 21a.

The organic layer 20a is made of, e.g., an organic resin material such as acrylate, polyurea, parylene, polyimide, or polyamide. The organic layer 20a may be thinner than the thickest among the first inorganic layer 19, the second inorganic layer 21a, and the third inorganic layer 22a. Conventionally, since an organic layer is formed by an inkjet method, the organic layer (e.g., 3 μm to 5 μm or more) is thicker than an inorganic layer. In the present embodiment, however, as described later, a thin organic layer 20a can be formed because an organic film 20, which will become the organic layer 20a, is formed by vacuum deposition. As shown in FIG. 2, the peripheral end face of the organic layer 20a is aligned with the peripheral end face of the second inorganic layer 21a by a production method described later.

The organic EL display device 30a described above is flexible and is configured to display an image by emitting light as appropriate from the light emitting layers 3 of the organic EL layers 16 via the TFTs 12 at the sub-pixels.

Next, a method for producing the organic EL display device 30a of the present embodiment will be described with reference to FIGS. 5 to 9. FIGS. 5 to 9 are sectional views illustrating the method for producing the organic EL display device 30a. The method for producing the organic EL display device 30a of the present embodiment includes: an organic EL element forming process; and an encapsulation film forming process including a first inorganic layer forming process, an organic film forming process, a second inorganic layer forming process, an organic layer forming process, and a third inorganic layer forming process.

<Organic EL Element Forming Process>

The basecoat film 11 and the organic EL element 18 (the TFTs 12, the planarizing film 13, the first electrodes 14, the edge cover 15, the organic EL layers 16 (the hole injection layers 1, the hole transport layers 2, the light emitting layers 3, the electron transport layers 4, and the electron injection layers 5), and the second electrode 17) are formed on the surface of the base substrate 10 made of, e.g., a polyimide resin by a well-known method.

<Encapsulation Film Forming Process>

Figure 5:
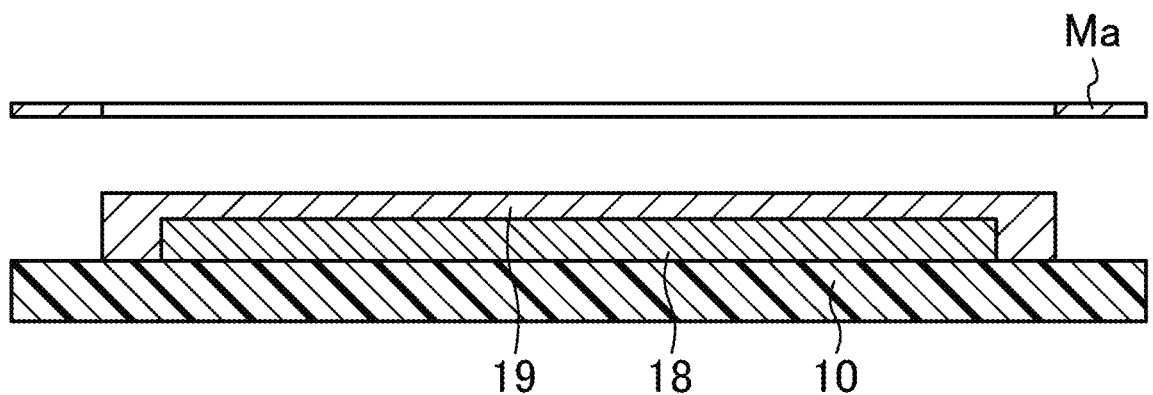
FIG. 5 is a first sectional view illustrating a method for producing the organic EL display device according to the first embodiment of the present invention.

First, as shown in FIG. 5, the first inorganic layer 19 is formed by depositing an inorganic insulating film such as, e.g., a silicon nitride film with a thickness of about 500 nm by plasma chemical vapor deposition (CVD) using a mask Ma such that the inorganic insulating film covers the organic EL element 18 formed in the organic EL element forming process (first inorganic layer forming process).

Figure 6:
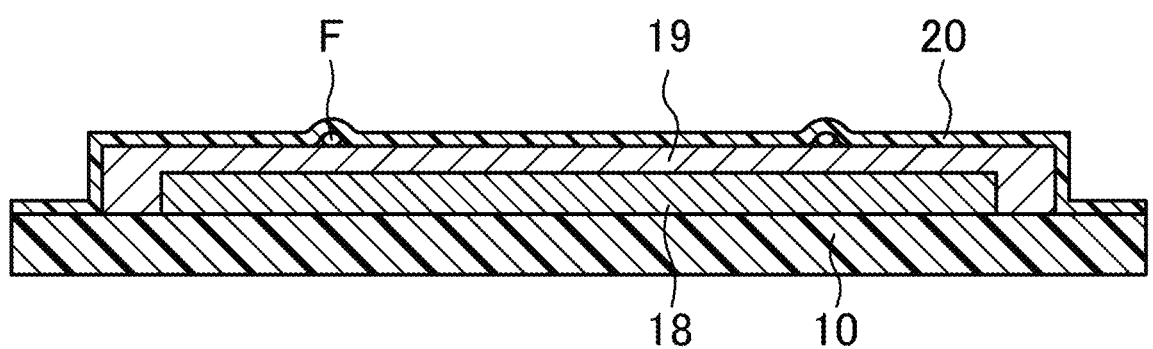
FIG. 6 is a second sectional view illustrating the method for producing the organic EL display device according to the first embodiment of the present invention.

Next, as shown in FIG. 6, the organic film 20 such as, e.g., acrylate is formed with a thickness of about 100 nm to 300 nm by vacuum deposition on the entire surface of the substrate having the first inorganic layer 19 formed thereon (organic film forming process).

Figure 7:
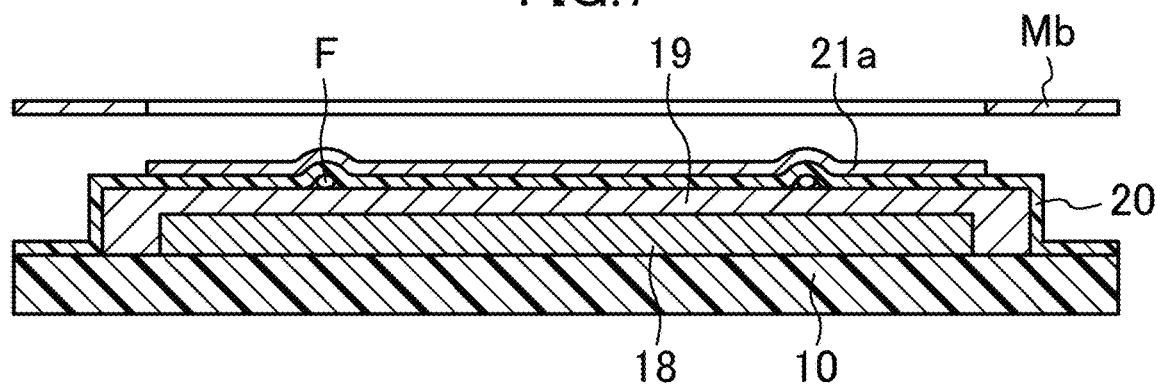
FIG. 7 is a third sectional view illustrating the method for producing the organic EL display device according to the first embodiment of the present invention.

Then, as shown in FIG. 7, the second inorganic layer 21a overlapping the first inorganic layer 19 is formed by depositing an inorganic insulating film such as, e.g., a silicon nitride film with a thickness of about 200 nm by plasma CVD using a mask Mb on the substrate having the organic film 20 deposited thereon (second inorganic layer forming process). The aperture area of the mask Mb is smaller than that of the mask Ma (see FIGS. 5 and 7).

Figure 8:
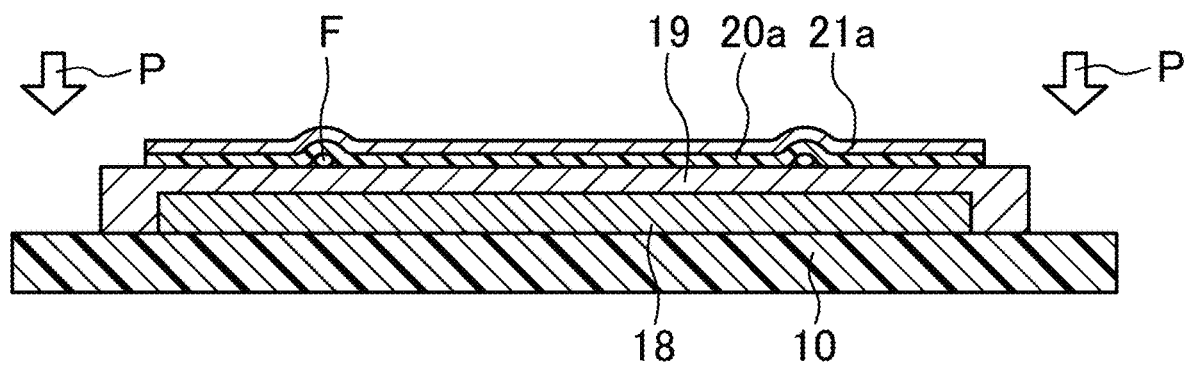
FIG. 8 is a fourth sectional view illustrating the method for producing the organic EL display device according to the first embodiment of the present invention.

As shown in FIG. 8, the organic film 20 exposed from the second inorganic layer 21a is removed by ashing (e.g., using plasma P) with the second inorganic layer 21a as a mask to form an organic layer 20a (organic layer forming process). Since the organic film 20 is ashed with the second inorganic layer 21a as a mask, the peripheral end face of the organic layer 20a is aligned with the peripheral end face of the second inorganic layer 21a. As used herein, (the positions of) the peripheral end faces being aligned with each other means the peripheral end faces are approximately aligned with each other with a displacement therebetween within 1 μm to 2 μm.

Figure 9:
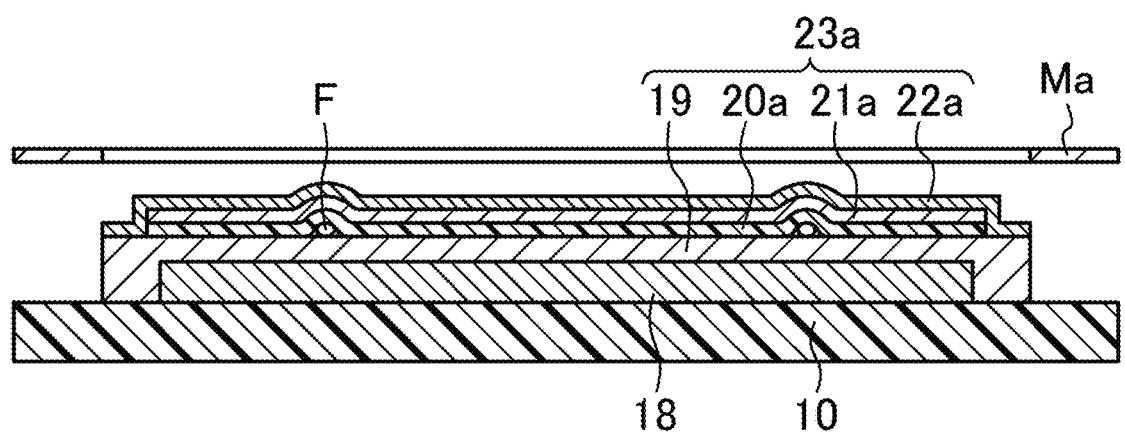
FIG. 9 is a fifth sectional view illustrating the method for producing the organic EL display device according to the first embodiment of the present invention.

Lastly, as shown in FIG. 9, the third inorganic layer 22a covering the peripheral end face of the organic layer 20a and the second inorganic layer 21a is formed by depositing an inorganic insulating film such as, e.g., a silicon nitride film with a thickness of about 400 nm to 500 nm by plasma CVD using the mask Ma on the substrate having the organic layer 20a formed thereon (third inorganic layer forming process). Since the mask Ma used to form the first inorganic layer 19 is used to form the third inorganic layer 22a, the peripheral end face of the third inorganic layer 22a is roughly aligned with the peripheral end face of the first inorganic layer 19. As used herein, the peripheral end faces being roughly aligned with each other means that, since the thin films are deposited using the same mask, the peripheral end face of the thin film deposited later is aligned to some extent with the peripheral end face of the thin film deposited earlier, and means that the peripheral end faces of these thin films are not accurately aligned with each other due to alignment accuracy of the mask and a CVD deposition material deposited behind the mask.

The organic EL display device 30a of the present embodiment is produced in this manner.

As described above, the organic EL display device 30a of the present embodiment and the production method therefor have the following effects (1) and (2).

(1) In the organic layer forming process, the organic film 20 exposed from the second inorganic layer 21a is removed to form the organic layer 20a. Accordingly, the peripheral end face of the second inorganic layer 21a is aligned with the peripheral end face of the organic layer 20a. The peripheral end of the organic layer 20a is thus formed accurately. The third inorganic layer 22a covers the peripheral end face of the second inorganic layer 21a. Accordingly, even when foreign matter F is present on the surface of the first inorganic layer 19, the organic layer 20a covers the foreign matter F and the second inorganic layer 21a and the third inorganic layer 22a are sequentially formed on the organic layer 20a to form the encapsulation film 23a. The encapsulation film 23a thus has sufficient encapsulation capability. Accordingly, the organic EL display device 30a having the encapsulation film 23a with sufficient encapsulation capability is implemented. Moreover, the peripheral end of the organic layer 20a is accurately formed, and the organic EL display device 30a with a narrower frame is thus implemented. Since a thin organic layer 20a is formed by vapor deposition, the first inorganic layer 19, the second inorganic layer 21a, and the third inorganic layer 22a will be less distorted when being bent. Flexibility of the encapsulation film 23a is thus improved.

(2) In the organic layer forming process, the organic film 20 exposed from the second inorganic layer 21a is removed with the second inorganic layer 21a as a mask. Accordingly, the peripheral end face of the second inorganic layer 21a can be aligned with the peripheral end face of the organic layer 20a without preparing a mark separately.

Second Embodiment

Figure 10:
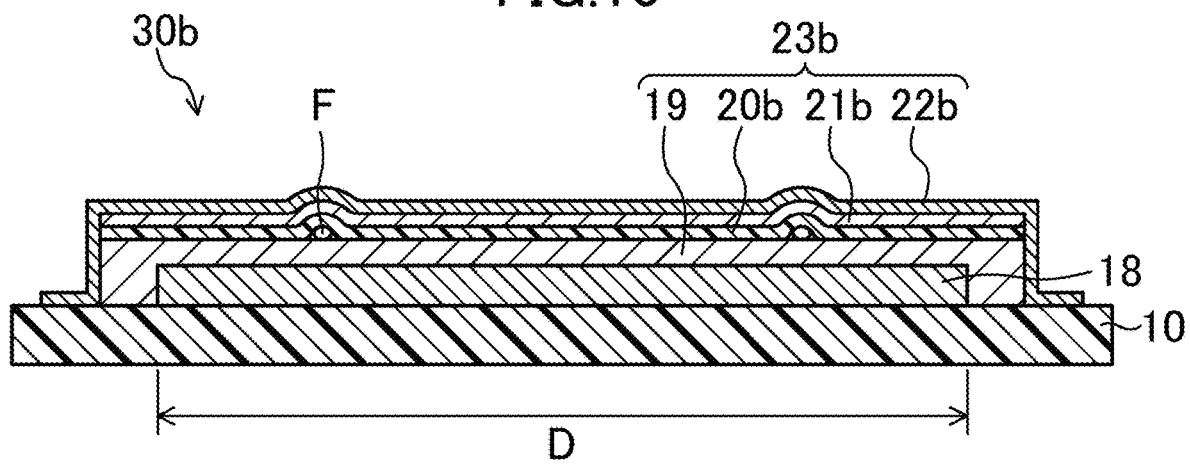
FIG. 10 is a sectional view showing a schematic configuration of an organic EL display device according to a second embodiment of the present invention.

FIGS. 10 to 15 illustrate a second embodiment of the display device according to the present invention. FIG. 10 is a sectional view showing a schematic configuration of an organic EL display device 30b of the present embodiment. In the following embodiments, the same portions as those in FIGS. 1 to 9 are denoted with the same reference characters as those in FIGS. 1 to 9, and detailed description thereof will be omitted.

Although the organic EL display device 30a in which the peripheral end face of the third inorganic layer 22a is aligned with the peripheral end face of the first inorganic layer 19 is illustrated in the first embodiment, the organic EL display device 30b in which the peripheral end face of a third inorganic layer 22b is located outside the peripheral end face of the first inorganic layer 19, etc. is illustrated in the second embodiment.

As shown in FIG. 10, the organic EL display device 30b includes: a base substrate 10; an organic EL element 18 formed on the base substrate 10 with a basecoat film 11 interposed therebetween; and an encapsulation film 23b covering the organic EL element 18. As in the organic EL display device 30a of the first embodiment, in the organic EL display device 30b, a rectangular display region D is defined by the organic EL element 18 as shown in FIG. 10, and a plurality of pixels are arranged in a matrix in the display region D.

As shown in FIG. 10, the encapsulation film 23b includes the first inorganic layer 19 covering the organic EL element 18, an organic layer 20b and a second inorganic layer 21b which are sequentially formed on the first inorganic layer 19, and a third inorganic layer 22b covering the peripheral end face of the organic layer 20b and the second inorganic layer 21b.

The first inorganic layer 19, the second inorganic layer 21b, and the third inorganic layer 22b are made of, e.g., an inorganic insulating film such as a silicon nitride film, a silicon oxide film, or a silicon oxynitride film. The second inorganic layer 21b is preferably made of, e.g., a silicon nitride film having high barrier properties. As shown in FIG. 10, foreign matter F called a particle is present on the surface of the first inorganic layer 19 which faces the organic layer 20b. It goes without saying that it is preferable that no foreign matter F be present on the surface of the first inorganic layer 19.

As shown in FIG. 10, the peripheral end face of the first inorganic layer 19 is roughly aligned with the peripheral end faces of the organic layer 20b and the second inorganic layer 21b by a production method described later.

The organic layer 20b is made of, e.g., an organic resin material such as acrylate, polyurea, parylene, polyimide, or polyamide. The organic layer 20b is thinner than the thickest among the first inorganic layer 19, the second inorganic layer 21b, and the third inorganic layer 22b. As shown in FIG. 10, the peripheral end face of the organic layer 20b is aligned with the peripheral end face of the second inorganic layer 21b.

The organic EL display device 30b described above is flexible and is configured to display an image by emitting light as appropriate from light emitting layers 3 of organic EL layers 16 via TFTs 12 at sub-pixels.

Figure 11:
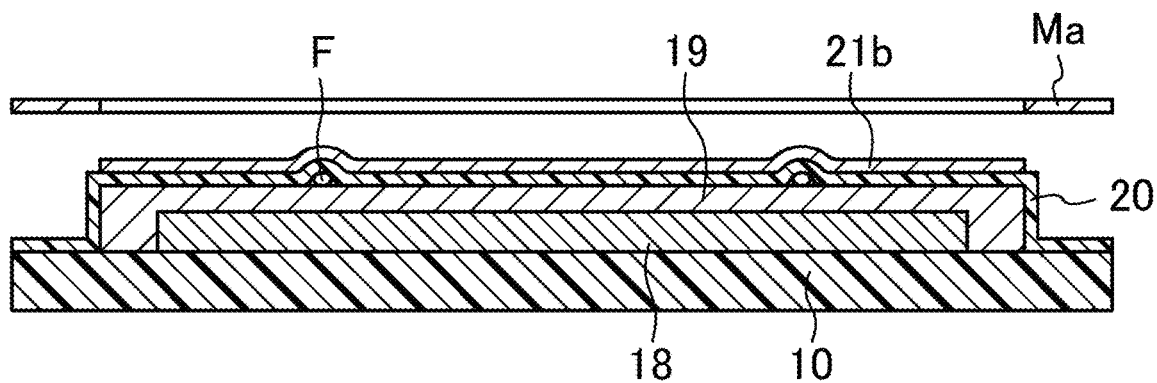
FIG. 11 is a first sectional view illustrating a method for producing the organic EL display device according to the second embodiment of the present invention.
Figure 12:
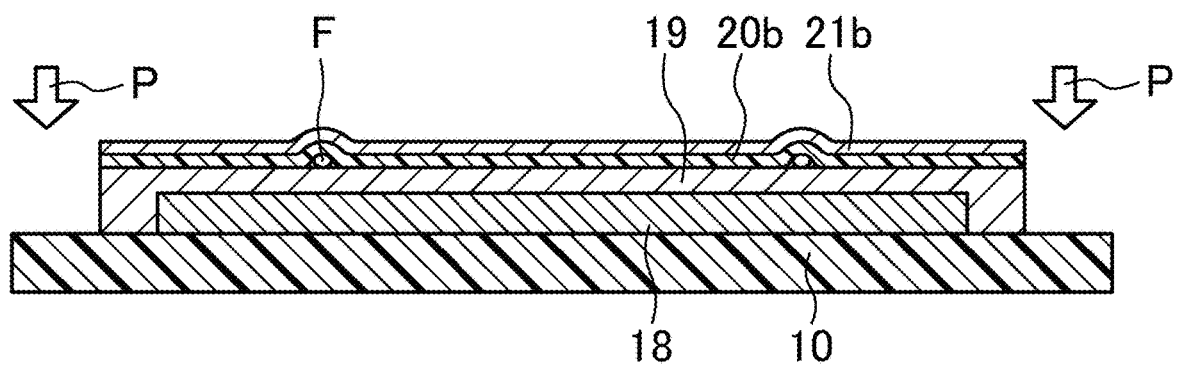
FIG. 12 is a second sectional view illustrating the method for producing the organic EL display device according to the second embodiment of the present invention.
Figure 13:
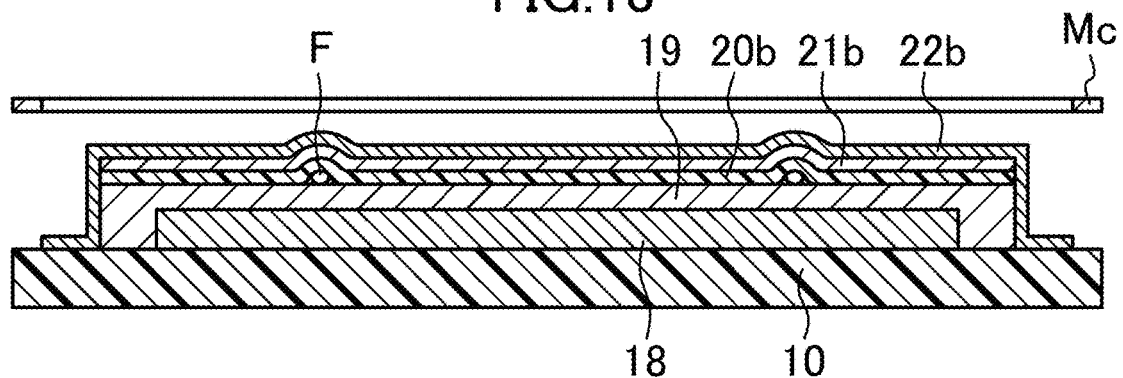
FIG. 13 is a third sectional view illustrating the method for producing the organic EL display device according to the second embodiment of the present invention.

Next, a method for producing the organic EL display device 30b of the present embodiment will be described with reference to FIGS. 11 to 13. FIGS. 11 to 13 are sectional views illustrating the method for producing the organic EL display device 30b. The method for producing the organic EL display device 30b of the present embodiment includes: an organic EL element forming process; and an encapsulation film forming process including a first inorganic layer forming process, an organic film forming process, a second inorganic layer forming process, an organic layer forming process, and a third inorganic layer forming process. Since the organic EL element forming process, the first inorganic layer forming process, and the organic film forming process of the present embodiment are the same as those described in the first embodiment, only the second inorganic layer forming process and the subsequent processes will be described.

<Encapsulation Film Forming Process>

First, as shown in FIG. 11, the second inorganic layer 21b overlapping the first inorganic layer 19 is formed by depositing, on a substrate having the organic film 20 deposited thereon in the organic film forming process of the first embodiment, an inorganic insulating film such as, e.g., a silicon nitride film with a thickness of about 200 nm by plasma CVD using a mask Ma used to form the first inorganic layer 19 (second inorganic layer forming process). Since the second inorganic layer 21b is formed with the mask Ma used to form the first inorganic layer 19, the peripheral end face of the second inorganic layer 21b is roughly aligned with the peripheral end face of the first inorganic layer 19.

Then, as shown in FIG. 12, the organic film 20 exposed from the second inorganic layer 21b is removed by ashing (e.g., using plasma P) with the second inorganic layer 21b as a mask to form the organic layer 20b (organic layer forming process). Since the organic film 20 is ashed with the second inorganic layer 21b as a mask, the peripheral end face of the organic layer 20b is aligned with the peripheral end face of the second inorganic layer 21b.

Lastly, as shown in FIG. 13, the third inorganic layer 22b covering the peripheral end face of the organic layer 20b and the second inorganic layer 21b is formed by depositing an inorganic insulating film such as, e.g., a silicon nitride film with a thickness of about 400 nm to 500 nm by plasma CVD using a mask Mc on the substrate having the organic layer 20b formed thereon (third inorganic layer forming process). The aperture area of the mask Mc is larger than that of the mask Ma (see FIGS. 11 and 13).

The organic EL display device 30b of the present embodiment is produced in this manner.

Figure 14:
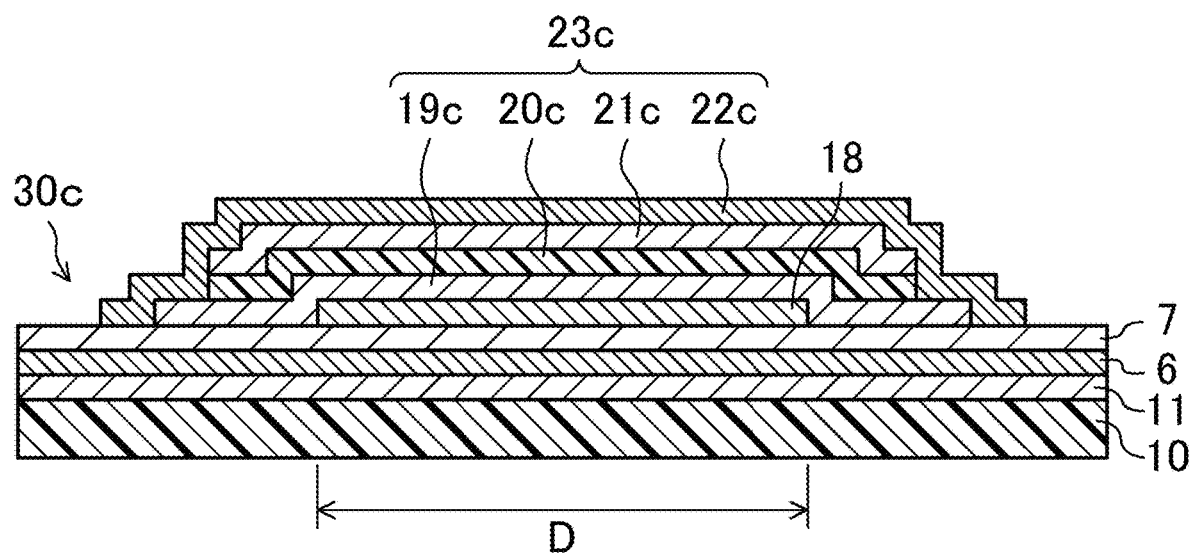
FIG. 14 is a sectional view showing a schematic configuration of a modification of the organic EL display device according to the second embodiment of the present invention.
Figure 15:
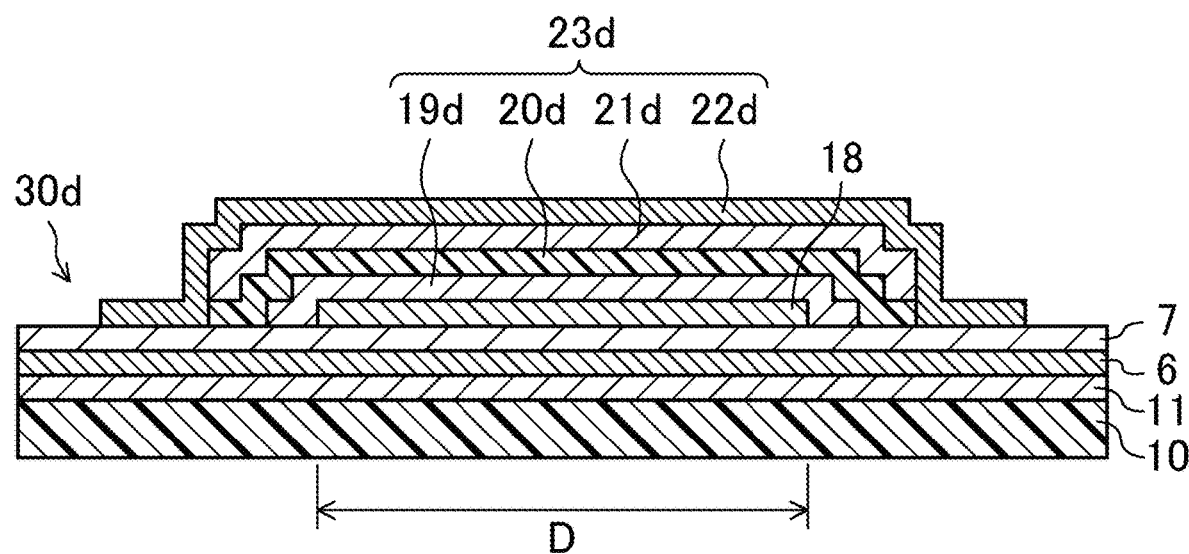
FIG. 15 is a sectional view showing a schematic configuration of another modification of the organic EL display device according to the second embodiment of the present invention.

Although the organic EL display device 30b in which the peripheral end face of the second inorganic layer 21b is roughly aligned with the peripheral end face of the first inorganic layer 19 is illustrated in the present embodiment, the peripheral end face of the second inorganic layer 21b may not be aligned with the peripheral end face of the first inorganic layer 19 as in organic EL display devices 30c, 30d. FIG. 14 is a sectional view showing a schematic configuration of the organic EL display device 30c that is a modification of the organic EL display device 30b. FIG. 15 is a sectional view showing a schematic configuration of the organic EL display device 30d that is another configuration of the organic EL display device 30b.

As shown in FIG. 14, in an encapsulation film 23c of the organic EL display device 30c which includes a first inorganic layer 19c, an organic layer 20c, a second inorganic layer 21c, and a third inorganic layer 22c, the peripheral end face of the first inorganic layer 19c is located outside the peripheral end face of the organic layer 20c and the peripheral end face of the second inorganic layer 21c. As shown in FIG. 15, in an encapsulation film 23d of the organic EL display device 30d which includes a first inorganic layer 19d, an organic layer 20d, a second inorganic layer 21d, and a third inorganic layer 22d, the peripheral end face of the first inorganic layer 19d is located inside the peripheral end face of the organic layer 20d and the peripheral end face of the second inorganic layer 21d. The first inorganic layers 19c, 19d, the second inorganic layers 21c, 21d, and the third inorganic layers 21c, 22d are made of, e.g., an inorganic insulating film such as a silicon nitride film, a silicon oxide film, or a silicon oxynitride film. The second inorganic layers 21c, 21d are preferably made of, e.g., a silicon nitride film having high barrier properties. The organic layers 20c, 20d are made of, e.g., an organic resin material such as acrylate, polyurea, parylene, polyimide, or polyamide. As shown in FIGS. 14 and 15, in a region outside the display region D, the third inorganic layer 22c, 22d contacts an interlayer insulating film 7 that is an inorganic layer and forms a part of each TFT 12. Although the configuration in which the third inorganic layer 22c, 22d contacts the inorganic layer forming the interlayer insulating film 7 is illustrated in the present embodiment, the third inorganic layer 22c, 22d may contact at least one inorganic layer out of the gate insulating film 6 and the interlayer insulating film 7 which form a part of each TFT 12 and the basecoat film 11.

As described above, the organic EL display device 30b of the present embodiment and the production method therefor have the above effects (1), (2) and the following effect (3).

The effect (1) will be described in detail. In the organic layer forming process, the organic film 20 exposed from the second inorganic layer 21b is removed to form the organic layer 20b. Accordingly, the peripheral end face of the second inorganic layer 21b is aligned with the peripheral end face of the organic layer 20b. The peripheral end of the organic layer 20b is thus formed accurately. The third inorganic layer 22b covers the peripheral end face of the first inorganic layer 19 and the peripheral end face of the second inorganic layer 21b. Accordingly, even when foreign matter F is present on the surface of the first inorganic layer 19, the organic layer 20b covers the foreign matter F and the second inorganic layer 21b and the third inorganic layer 22b are sequentially formed on the organic layer 20b to form the encapsulation film 23b. The encapsulation film 23b thus has sufficient encapsulation capability. Accordingly, the organic EL display device 30b having the encapsulation film 23b with sufficient encapsulation capability is implemented. Moreover, the peripheral end of the organic layer 20b is accurately formed, and the organic EL display device 30b with a narrower frame is thus implemented. Since a thin organic layer 20b is formed by vapor deposition, the first inorganic layer 19, the second inorganic layer 21b, and the third inorganic layer 22b will be less distorted when being bent. Flexibility of the encapsulation film 23b is thus improved.

The effect (2) will be described in detail. In the organic layer forming process, the organic film 20 exposed from the second inorganic layer 21b is removed with the second inorganic layer 21b as a mask. Accordingly, the peripheral end face of the second inorganic layer 21b can be aligned with the peripheral end face of the organic layer 20b without preparing a mask separately.

(3) In the third inorganic layer forming process, the third inorganic layer 22b covers the peripheral end face of the first inorganic layer 19. The encapsulation film 23b therefore has improved encapsulation capability, and degradation of the organic EL element 18 is restrained as compared to the organic EL display device 30a of the first embodiment.

Third Embodiment

Figure 16:
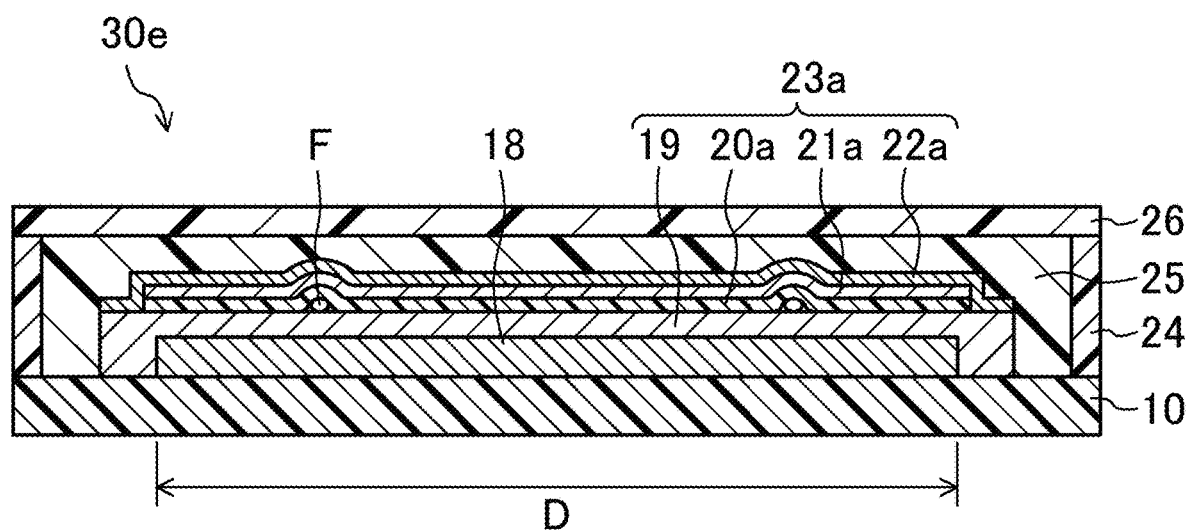
FIG. 16 is a sectional view showing a schematic configuration of an organic EL display device according to a third embodiment of the present invention.

FIG. 16 illustrates a third embodiment of the display device according to the present invention. FIG. 16 is a sectional view showing a schematic configuration of an organic EL display device 30e of the present embodiment.

Although the organic EL display devices 30a, 30b (30c, 30d) having no encapsulation substrate are illustrated in the first and second embodiments, the organic EL display device 30e having an encapsulation substrate 26 is illustrated in the present embodiment.

As shown in FIG. 16, the organic EL display device 30e includes: the base substrate 10; the organic EL element 18 formed on the base substrate 10 with the basecoat film 11 interposed therebetween; the encapsulation film 23a covering the organic EL element 18; and an encapsulation substrate 26 provided on the encapsulation film 23a with an encapsulation resin layer 25 and a sealant 24 interposed therebetween. As in the organic EL display device 30a of the first embodiment, in the organic EL display device 30e, a rectangular display region D is defined by the organic EL element 18 as shown in FIG. 16, and a plurality of pixels are arranged in a matrix in the display region D.

The sealant 24 is provided in a frame shape so that the sealant 24 bonds the base substrate 10 and the encapsulation substrate 26 along their peripheral ends. The sealant 24 is comprised of, e.g., an ultraviolet (UV) curable and/or thermosetting sealant resin such as an epoxy resin, an acrylic resin, a polyimide resin, or a phenolic resin.

The encapsulation resin layer 25 is made of, e.g., a thermosetting encapsulation resin such as an epoxy resin or a silicone resin. The encapsulation resin contains, e.g., a metal oxide such as calcium oxide (CaO), barium oxide (BaO), or aluminum oxide ($Al_2O_3$), activated carbon, silica gel, zeolite, etc. The resin encapsulation layer 25 therefore serves as a getter that adsorbs moisture, oxygen, etc.

The encapsulation substrate 26 is, e.g., a flexible plastic substrate made of a polyimide resin etc.

The organic EL display device 30e with the above configuration is flexible and is configured to display an image by emitting light as appropriate from light emitting layers 3 of organic EL layers 16 via TFTs 12 at sub-pixels.

The organic EL display device 30e of the present embodiment can be produced by the method for producing the organic EL display device 30a of the first embodiment.

First, the sealant resin is placed in a frame shape by, e.g., a dispenser system along the peripheral end of the base substrate 10 of the organic EL display device 30a produced in the first embodiment, and the encapsulation resin is placed inside the sealant resin.

Next, the base substrate 10 having both the sealant resin and the encapsulation resin placed on its surface and the encapsulation substrate 26 are bonded in a reduced pressure atmosphere. The pressure is then restored to the atmospheric pressure to press the outer surfaces of the base substrate 10 and the encapsulation substrate 26.

The sealant resin between the base substrate 10 and the encapsulation substrate 26 is irradiated with, e.g., UV light and then heated to cure the sealant resin and the encapsulation resin. The sealant 24 and the encapsulation resin layer 25 are thus formed.

The organic EL display device 30e of the present embodiment is produced in this manner.

As described above, the organic EL display device 30e of the present embodiment and the production method therefor have the above effects (1), (2) and the following effect (4).

(4) Since the sealant 24, the encapsulation resin layer 25, and the encapsulation substrate 26 are located outside the encapsulation film 23a, degradation of the organic EL element 18 is restrained as compared to the organic EL display device 30a of the first embodiment.

Although the present embodiment is described with respect to the configuration in which the encapsulation substrate 26 is added to the organic EL display device 30a of the first embodiment, the encapsulation substrate 26 may be added to the organic EL display device 30b of the second embodiment etc.

Other Embodiments

The above embodiments are described with respect to the organic EL layers having a five-layered structure comprised of the hole injection layer, the hole transport layer, the light emitting layer, the electron transport layer, and the electron injection layer. However, the organic EL layers may have, e.g., a three-layered structure comprised of a layer serving as both a hole injection layer and a hole transport layer, a light emitting layer, and a layer serving as both an electron transport layer and an electron injection layer.

The above embodiments are described with respect to the organic EL display device in which the first electrodes serve as an anode and the second electrode serves as a cathode. However, the present invention is also applicable to organic EL display devices in which the organic EL layers have an inverted multilayered structure, namely organic EL display devices in which the first electrodes serve as a cathode and the second electrode serves as an anode.

The above embodiments are described with respect to the organic EL display device that includes an element substrate using those electrodes of the TFTs which are connected to the first electrodes as drain electrodes. However, the present invention is also applicable to organic EL display devices that include an element substrate using those electrodes of the TFTs which are connected to the first electrodes as source electrodes.

The above embodiments are described with respect to the organic EL display device as an example of a display device. However, the present invention is also applicable to display devices including a plurality of current-driven light emitting elements. For example, the present invention is applicable to display devices including quantum-dot light emitting diodes (QLEDs), namely light emitting elements using a quantum-dot containing layer.

INDUSTRIAL APPLICABILITY

As described above, the present invention is useful for flexible display devices.

DESCRIPTION OF REFERENCE CHARACTERS

C Connection Portion
D Display Region
7 Interlayer Insulating Film (Inorganic Layer)
10 Base Substrate
12 TFT (Switching Element)
14 First Electrode
16 Organic EL Layer (Light Emitting Layer)
17 Second Electrode
18 Organic EL Element (Light Emitting Element)
19, 19c, 19d First Inorganic Layer
20 Organic Film
20a to 20d Organic Layer
21a to 21d Second Inorganic Layer
22a to 22d Third Inorganic Layer
23a to 23d Encapsulation Film
30a to 30e Organic EL Display Device

The invention claimed is:

1. A method for producing a display device which includes a light emitting element forming process of forming a light emitting element on a base substrate and an encapsulation film forming process of forming an encapsulation film such that the encapsulation film covers the light emitting element, characterized in that
the encapsulation film forming process includes
a first inorganic layer forming process of forming a first inorganic layer such that the first inorganic layer covers the light emitting element,
an organic film forming process of forming an organic film such that the organic film covers the first inorganic layer,
a second inorganic layer forming process of forming a second inorganic layer on the organic film such that the second inorganic layer overlaps the first inorganic layer,
an organic layer forming process of removing the organic film exposed from the second inorganic layer by aching to form an organic layer, and
a third inorganic layer forming process of forming a third inorganic layer such that the third inorganic layer covers a peripheral end face of the organic layer and the second inorganic layer,
in the organic layer forming process, the organic film is removed such that a peripheral end face of the second inorganic layer is aligned with the peripheral end face of the organic layer, and
in the third inorganic layer forming process, the third inorganic layer is formed so as to cover a peripheral end face of the first inorganic layer or the peripheral end face of the second inorganic layer.

2. The method of claim 1, characterized in that in the organic layer forming process, the organic film is removed with the second inorganic layer as a mask.

3. The method of claim 1, characterized in that in the organic film forming process, the organic film is formed by a deposition process.

4. The method of claim 1, characterized in that the light emitting element is an organic EL element.

5. The method of claim 1, characterized in that the base substrate is flexible.

* * * * *